United States Patent
Woelk et al.

(10) Patent No.: US 8,555,809 B2
(45) Date of Patent: Oct. 15, 2013

(54) METHOD FOR CONSTANT CONCENTRATION EVAPORATION AND A DEVICE USING THE SAME

(75) Inventors: Egbert Woelk, North Andover, MA (US); Ronald L. DiCarlo, Jr., Danville, NH (US)

(73) Assignee: Rohm and Haas Electronic Materials, LLC, Marlborough, MA (US)

( * ) Notice: Subject to any disclaimer, the term of this patent is extended or adjusted under 35 U.S.C. 154(b) by 295 days.

(21) Appl. No.: 12/687,288

(22) Filed: Jan. 14, 2010

(65) Prior Publication Data

US 2011/0171383 A1    Jul. 14, 2011

(51) Int. Cl.
| | | |
|---|---|---|
| C23C 16/448 | (2006.01) | |
| C23C 16/44 | (2006.01) | |
| C23C 16/455 | (2006.01) | |
| F22B 5/00 | (2006.01) | |
| C23C 16/06 | (2006.01) | |
| C23C 16/22 | (2006.01) | |

(52) U.S. Cl.
USPC .............. 118/723 VE; 118/715; 118/663; 156/345.27; 156/345.24; 156/345.37; 122/233; 122/234

(58) Field of Classification Search
USPC .............. 118/723 VE, 715, 663; 156/345.27, 156/345.24, 345.37; 122/233, 234
See application file for complete search history.

(56) References Cited

U.S. PATENT DOCUMENTS

| | | | | |
|---|---|---|---|---|
| 1,344,423 A | * | 6/1920 | Manker | 236/19 |
| 1,770,384 A | * | 7/1930 | Aske | 392/395 |
| 1,960,098 A | * | 5/1934 | Breitenbach | 422/306 |
| 2,020,038 A | * | 11/1935 | Moore | 159/17.1 |
| 2,219,673 A | * | 10/1940 | Zenner | 165/143 |
| 2,264,926 A | * | 12/1941 | York et al. | 432/76 |
| 2,750,758 A | * | 6/1956 | Hoye et al. | 62/155 |
| 2,755,293 A | * | 7/1956 | McDonald | 554/180 |

(Continued)

FOREIGN PATENT DOCUMENTS

| | | |
|---|---|---|
| CN | 1242248 A1 | 1/2000 |
| DE | 2243714 A * | 3/1974 |

(Continued)

OTHER PUBLICATIONS

"Vaporstation (TM) Delivery System: A Central Delivery System for MOCVD Precursors" Dow Electronic Materials; ME05N050, Rev. 6; Aug. 2009; www.rohmhaas.com.

(Continued)

*Primary Examiner* — Rudy Zervigon
(74) *Attorney, Agent, or Firm* — Cantor Colburn LLP

(57) ABSTRACT

Disclosed herein is a device comprising an evaporator; and a heat exchanger; the heat exchanger being in fluid communication with evaporator; evaporator comprising an outer casing; and an inner casing that is disposed within the outer casing; the inner casing contacting a plate; wherein the inner casing encloses a first conduit that is operative to introduce a carrier fluid into evaporator; and a second conduit that is operative to remove carrier fluid entrained with a precursor; wherein the outer casing is detachably attached to the plate; the plate contacting a first precursor conduit that is operative to introduce the precursor into evaporator from the heat exchanger; where the heat exchanger is disposed proximate to evaporator at a distance effective to maintain the precursor in evaporator at a substantially constant temperature when the ambient temperature around the heat exchanger and evaporator fluctuates by an amount of up to about ±35° C.

15 Claims, 2 Drawing Sheets

(56) References Cited

U.S. PATENT DOCUMENTS

| | | | |
|---|---|---|---|
| 2,836,412 A * | 5/1958 | Krieger | 266/241 |
| 2,896,658 A * | 7/1959 | Jones | 137/340 |
| 3,000,364 A * | 9/1961 | Steever | 122/4 R |
| 3,078,529 A * | 2/1963 | Cooper et al. | 164/348 |
| 3,153,439 A * | 10/1964 | Golden | 431/41 |
| 3,398,720 A * | 8/1968 | Romanos | 122/32 |
| 3,407,787 A * | 10/1968 | Golden | 122/4 R |
| 3,507,752 A * | 4/1970 | Germerdonk | 202/187 |
| 3,724,530 A * | 4/1973 | Latash et al. | 164/515 |
| 3,728,100 A * | 4/1973 | Wooding | 75/10.23 |
| 3,965,871 A * | 6/1976 | Morton | 123/25 B |
| 3,977,364 A * | 8/1976 | Gijsbers et al. | 122/366 |
| 4,167,454 A * | 9/1979 | Feres | 202/236 |
| 4,494,484 A * | 1/1985 | Ruzek | 122/34 |
| 4,545,801 A | 10/1985 | Miyajiri et al. | |
| 4,545,853 A * | 10/1985 | Feres | 159/7 |
| 4,582,480 A | 4/1986 | Lynch et al. | |
| 4,584,064 A * | 4/1986 | Ciais et al. | 206/89 |
| 4,861,524 A | 8/1989 | Sielaff et al. | |
| 5,224,202 A * | 6/1993 | Arnold et al. | 392/399 |
| 5,254,219 A * | 10/1993 | Feres | 159/6.1 |
| 5,356,487 A * | 10/1994 | Goldstein et al. | 136/253 |
| 5,363,694 A * | 11/1994 | Grabowski | 73/40.7 |
| 5,776,255 A | 7/1998 | Asaba et al. | |
| 5,862,605 A * | 1/1999 | Horie et al. | 34/68 |
| 5,951,923 A * | 9/1999 | Horie et al. | 261/153 |
| 6,074,545 A * | 6/2000 | Ginatta | 205/363 |
| 6,101,316 A * | 8/2000 | Nagashima et al. | 392/388 |
| 6,135,433 A * | 10/2000 | Nurmi | 261/128 |
| 6,195,504 B1 * | 2/2001 | Horie et al. | 392/394 |
| 6,202,591 B1 * | 3/2001 | Witzman et al. | 118/723 VE |
| 6,269,221 B1 * | 7/2001 | Horie et al. | 392/399 |
| 6,270,839 B1 * | 8/2001 | Onoe et al. | 427/248.1 |
| 6,282,368 B1 * | 8/2001 | Horie et al. | 392/394 |
| 6,283,066 B1 | 9/2001 | Nurmi | |
| 6,367,414 B2 * | 4/2002 | Witzman et al. | 118/723 VE |
| 6,505,469 B1 * | 1/2003 | Drube et al. | 62/48.1 |
| 6,637,475 B2 | 10/2003 | Noah et al. | |
| 6,799,440 B2 * | 10/2004 | Zeng et al. | 65/32.5 |
| 7,011,299 B2 * | 3/2006 | Curran | 261/66 |
| 7,025,337 B2 | 4/2006 | Curran | |
| 7,464,917 B2 * | 12/2008 | Lee et al. | 261/121.1 |
| 7,601,225 B2 * | 10/2009 | Tuominen et al. | 118/726 |
| 7,641,737 B2 * | 1/2010 | Yi | 118/726 |
| 7,699,295 B2 * | 4/2010 | Lee et al. | 261/121.1 |
| 7,736,399 B2 * | 6/2010 | Ravenda et al. | 48/127.1 |
| 7,775,508 B2 * | 8/2010 | Choi et al. | 261/127 |
| 7,851,019 B2 * | 12/2010 | Tuominen et al. | 427/255.23 |
| 8,128,073 B2 * | 3/2012 | Gregg et al. | 261/142 |
| 2003/0235389 A1 | 12/2003 | Kang | |
| 2004/0000164 A1 * | 1/2004 | Stach et al. | 62/480 |
| 2004/0016404 A1 * | 1/2004 | Gregg et al. | 118/726 |
| 2007/0022953 A1 | 2/2007 | Choi et al. | |
| 2007/0079759 A1 * | 4/2007 | Lee et al. | 118/715 |
| 2009/0114157 A1 * | 5/2009 | Lee et al. | 118/726 |
| 2011/0171383 A1 * | 7/2011 | Woelk et al. | 427/255.23 |

FOREIGN PATENT DOCUMENTS

| | | |
|---|---|---|
| EP | 752558 A2 * | 1/1997 |
| EP | 834582 A2 * | 4/1998 |
| EP | 0849375 A1 | 6/1998 |
| JP | 53064670 A * | 6/1978 |
| JP | 01208448 A * | 8/1989 |
| JP | 10085581 A * | 4/1998 |
| JP | 10147870 A * | 6/1998 |
| JP | 2011167680 A * | 9/2011 |

OTHER PUBLICATIONS

"Vaporstation (TM) Central Vapor Delivery System Information Manual" Jul. 2009; Dow Electronic Materials Metalorganics.
European Search Report of corresponding European Application No. 11 15 0646.
European Search Report for Application No. 11150646.5, dated Feb. 1, 2012, 3 pages.

* cited by examiner

METHOD FOR CONSTANT CONCENTRATION EVAPORATION AND A DEVICE USING THE SAME

This disclosure relates to a method for constant concentration evaporation and an article using the same.

Metal-containing films are used in a variety of electronic and opto-electronic applications. Chemical vapor deposition ("CVD") processes are often used in the electronics industry, particularly the semiconductor industry, to deposit metal-containing layers (or films) on substrates. Metal-containing precursors and optionally dopants (hereinafter "precursors") are delivered to a deposition reactor and deposited on a substrate to form a metal-containing film. The precursors are generally provided in bubblers (also referred to as cylinders or evaporators). In use, a carrier fluid enters the bubbler, passes through the precursor, becomes saturated with the precursor, and then the carrier gas/precursor vapor mixture exits the cylinder and is directed to the deposition reaction chamber. In the deposition chamber, a layer or film containing the metal from the precursor is grown on a substrate. The substrates can be any suitable material such as silicon wafers, sapphire wafers, InP wafers, GaAs wafers, SiC wafers, germanium wafers, among others.

Bubblers, including those utilized in commercially available automatic refill systems, rely on relatively large fluid volumes to compensate for deviations in fluid level that can negatively effect the resulting vapor concentration. Since vapor sources in the fiber optics and semiconductor industries are often hazardous fluids, it is desirable to reduce the maximum allowable volume of many of these fluids within the work place. It is therefore desirable to reduce the required fluid volume at the point of vapor generation without compromising vapor concentration control.

A bubbler container comprises a single vessel, which holds an expendable volume of the precursor. A carrier fluid is introduced into the fluid column, travels up through, and exits the precursor surface into a headspace. As the carrier fluid passes through the fluid column it becomes entrained with vapor, which results in a corresponding reduction of the fluid volume. The entrained vapor is then transported to the surface of a substrate where it chemically reacts and forms a material film. If there is a variation in the temperature or pressure of the carrier fluid or the fluid, it results in the formation of non-uniform products.

In order to produce semiconductors or fibers that are within a narrow range of specification and that are reproducible and interchangeable, it is desirable to use a vapor concentration that does not fluctuate during the manufacturing processes. It is therefore desirable to control the temperature of the carrier fluid containing the vapor, the carrier fluid residence time (e.g., the liquid level in the bubbler) and the vapor pressure of the carrier fluid to obtain reproducible and consistent products.

One variable that affects the concentration of the chemical vapor in the carrier fluid is the temperature of the precursor. The vapor pressure of the volatile precursor is a function of the temperature of the precursor. Thus, at any given temperature, the carrier fluid becomes saturated with the chemical vapor at an equilibrium condition. The carrier fluid and chemical vapor coexist at their equilibrium saturation conditions as long as the temperature remains constant. If, however, the temperature drops, a portion of the chemical vapor condenses from the vapor state, resulting in a change in the concentration of the chemical vapor in the carrier fluid.

To control the temperature in the bubbler, commercially available units use a combined chiller and heater unit. These devices provide a convenient means of adjusting the temperature in the evaporator independent of the ambient temperature. To prevent condensation of the chemical vapor from the carrier fluid as it is delivered to the process equipment, the gas is not to be subjected to a temperature lower than that at which the saturation occurs. Low ambient temperature requires heating of the precursor, high ambient temperature requires cooling of the precursor.

During the saturation process, conversion of the precursor to a vapor results in the removal of heat from the liquid. The net effect of this heat removal is that the temperature of the precursor may drop below the control temperature of the cooling or heating medium. The temperature control unit attempts to compensate for the temperature drop by increasing the heat flow to the evaporator. However, conventional temperature control units do not adequately maintain a set temperature of the precursor in the evaporator during use.

Yet another variable that can affect the chemical vapor concentration in the carrier fluid is the pressure of the carrier fluid. Commercially available devices have made use of mechanical pressure regulators, which rely on springs and diaphragms to sense and control pressure. With such commercially available mechanical devices, however, there is an inherent delay in responding to system changes. This can result in pressure fluctuations, which, in turn, produce variations in the chemical vapor concentration.

U.S. Pat. No. 6,135,433 to Nurmi teaches controlling the temperature and the pressure of the precursor in the bubbler. The temperature is controlled by means of a heat jacket disposed around the bubbler and a temperature probe that is disposed in the precursor of the bubbler, while the pressure is controlled by pressure transducers in the carrier fluid line. However, the precursor is contained in storage tanks that are maintained at ambient conditions. This causes the precursor being supplied to the bubbler to be at different temperatures. In addition, since the heater is located on the outer surface of the bubbler, ambient temperature variations affect the performance of the heater and consequently the temperature of the precursor in the bubbler undergoes variations. These temperature variations lead to variations in product quality, which is undesirable.

U.S. Pat. No. 7,011,299 to Curran teaches a method and a system for controlling the delivery of vapor from a bubbler containing a supply of precursor. The vapor pressure of the carrier fluid and the precursor is controlled by controlling the pressure within the headspace of the bubbler to that of the precursor line, thus creating repeatable fluid level based on pressure and fluid dynamics and not relying on conventional level sensors and controllers. This system suffers from the drawback that the temperature of the carrier fluid and the temperature of the precursor are not closely controlled, leading to the concentration variations in the amount of the chemical deposited on the various substrates.

It is therefore desirable to have a bubbler where temperature and pressure variations are minimized so that product quality is stabilized.

Disclosed herein is a device comprising an evaporator; and a heat exchanger; the heat exchanger being in fluid communication with the evaporator; the evaporator comprising an outer casing; and an inner casing that is disposed within the outer casing; the inner casing contacting a plate; wherein the inner casing encloses a first conduit that is operative to introduce a carrier fluid into the evaporator; and a second conduit that is operative to remove the carrier fluid entrained with a precursor; wherein the outer casing is detachably attached to the plate; the plate contacting a first precursor conduit that is operative to introduce the precursor into the evaporator from the heat exchanger; where the heat exchanger is disposed proximate to the evaporator at a distance effective to maintain the precursor in the evaporator at a substantially constant temperature when the ambient temperature around the heat exchanger and the evaporator fluctuates by an amount of up to about ±35° C.

Disclosed herein too is a method comprising heating or cooling a precursor in a heat exchanger; discharging the precursor from the heat exchanger to an evaporator; the evaporator comprising an outer casing; and an inner casing that is disposed within the outer casing; the inner casing contacting a plate; wherein the inner casing encloses a first conduit; and a second conduit; introducing a carrier fluid into the evaporator via the first conduit; sparging the precursor with the carrier fluid; and removing the carrier fluid entrained with the precursor from the evaporator via the second conduit; where the proximity of the heat exchanger to the evaporator is effective to maintain the precursor in the evaporator at a substantially constant temperature when the ambient temperature around the heat exchanger and the evaporator fluctuates by an amount of up to about ±35° C.

Disclosed herein too is a method for manufacturing a device comprising disposing an inverted U-shaped conduit in a first hole, an inverted J-shaped conduit in a second hole and a first precursor conduit in a third hole on a plate; the plate being affixed with a heat exchanger; and disposing an inner casing and an outer casing on a side of the plate that is opposed to a side where the heat exchanger contacts the plate; the inner casing being contained in the outer casing; the inner casing enclosing the inverted U-shaped conduit, the inverted J-shaped conduit and the first precursor conduit.

Like reference numerals refer to like elements throughout.

Figure 1A:
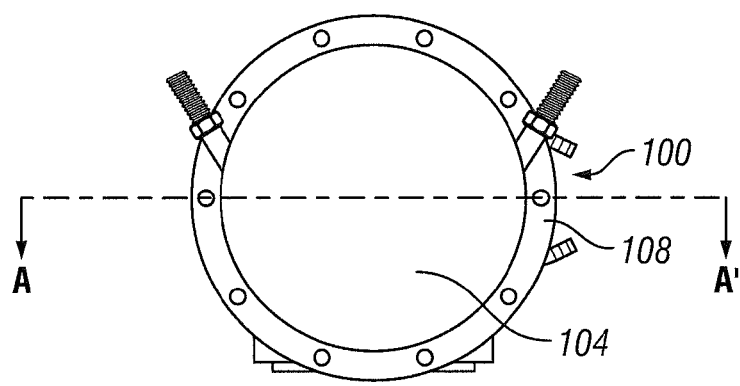
FIG. 1(A) depicts a top view of the evaporator 100.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items. As used herein, "substrate" refers to any surface upon which a metal-containing film is deposited by vapor deposition.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Disclosed herein is an evaporator in fluid communication with a first heat exchanger and disposed in proximity to the first heat exchanger such that precursors from the first heat exchanger are supplied to the evaporator at fairly constant temperatures over extended periods of time. By disposing the evaporator in proximity to the first heat exchanger, the effects of ambient temperature conditions on the temperature of the chemical liquid is minimized, thus permitting the evaporator to receive the precursor at a substantially constant temperature under a variety of ambient temperature conditions. As a result, the temperature of the precursor in the evaporator remains substantially constant over large periods of time.

In one embodiment, the temperature of the precursor supplied by the first heat exchanger is the same as the temperature of the precursor already present in the evaporator. The evaporator thus receives a supply of precursor that is maintained at a constant temperature. This minimizes any fluctuations in the quality of semiconductors or other devices manufactured using the evaporator. In short, by connecting the heat exchanger directly to the evaporator and by minimizing the piping between the heat exchanger and the evaporator, the fluctuations in temperature or pressure of the precursor in the evaporator are minimized over extended periods of time. This results in the production of uniform and high quality (e.g., reproducible) metal-containing films over large periods of time.

The first heat exchanger contacts the evaporator directly so that the precursor heated in the first heat exchanger travels to the evaporator without any loss of heat to the surroundings. In one embodiment, the precursor from the first heat exchanger is discharged into the evaporator and not into a jacket that surrounds the evaporator. In other words, the fluid heated in the heat exchanger is a reactive fluid (precursor) that is used for coating a substrate.

The distance between heat exchanger and evaporator should be as short as possible but could be any length as long as the tubing connecting heat exchanger and evaporator is perfectly heat insulated.

In one embodiment, there is no variation in temperature of the precursor in the fluid path that extends from the center of the first heat exchanger to the evaporator (or bubbler) when the ambient temperature around the heat exchanger and the evaporator fluctuates by a temperature of up to about ±15° C., specifically by a temperature of up to about ±25° C., and more specifically by a temperature of up to about ±35° C.

In another embodiment, the variation in temperature of the precursor in the fluid path that extends from the center of the first heat exchanger to the evaporator is less than or equal to about ±0.1° C., specifically less than or equal to about ±0.2° C., and more specifically less than or equal to about ±0.5° C. when the ambient temperature around the heat exchanger and the evaporator fluctuates by a temperature of up to about ±15° C., specifically by a temperature of up to about ±25° C., and more specifically by a temperature of up to about ±35° C.

In one embodiment, there is no variation in temperature of the precursor in the fluid path that extends from the center of the first heat exchanger to the evaporator. In another embodiment, the variation in temperature of the precursor in the fluid path that extends from the center of the first heat exchanger to the evaporator is less than or equal to about ±0.1° C., specifically less than or equal to about ±0.2° C., and more specifically less than or equal to about ±0.5° C. This results in the temperature in the precursor contained in first heat exchange not varying by an amount of greater than or equal to about ±0.1° C., specifically greater than or equal to about ±0.2° C., and more specifically greater than or equal to about ±0.5° C. over a period of greater than or equal to about 24 hours, specifically greater than or equal to about 36 hours and more specifically greater than or equal to about 48 hours.

By supplying fresh precursor to the evaporator at the same temperature as the precursor already present in the evaporator, temperature and pressure fluctuations of the precursor in the evaporator are reduced and the quality of products manufactured from the precursor suffer minimal variation. Minimal variation as referred to herein is ±0.5% of the vapor pressure of the precursor, which generally translates to ±0.125° C. fluctuation in the temperature. For example, if the liquid is trimethylgallium, it is desirable for the combination of the evaporator and the heat exchanger to control the vapor pressure of the trimethylgallium to within ±0.5% of the desired vapor pressure. Controlling the vapor pressure to within ±0.5% of the desired vapor pressure restricts temperature fluctuations within the trimethyl gallium to within ±0.125° C. of a desired temperature.

Figure 1B:
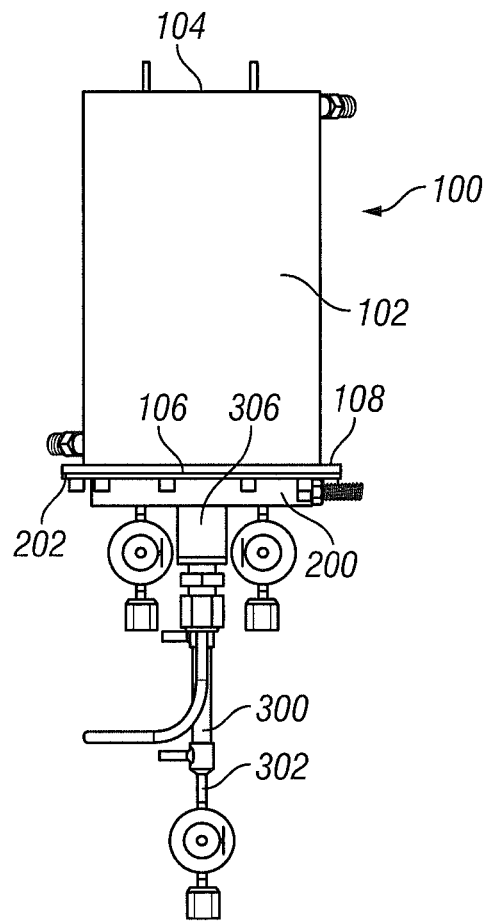
FIG. 1(B) depicts a side view of the evaporator 100.
Figure 2:
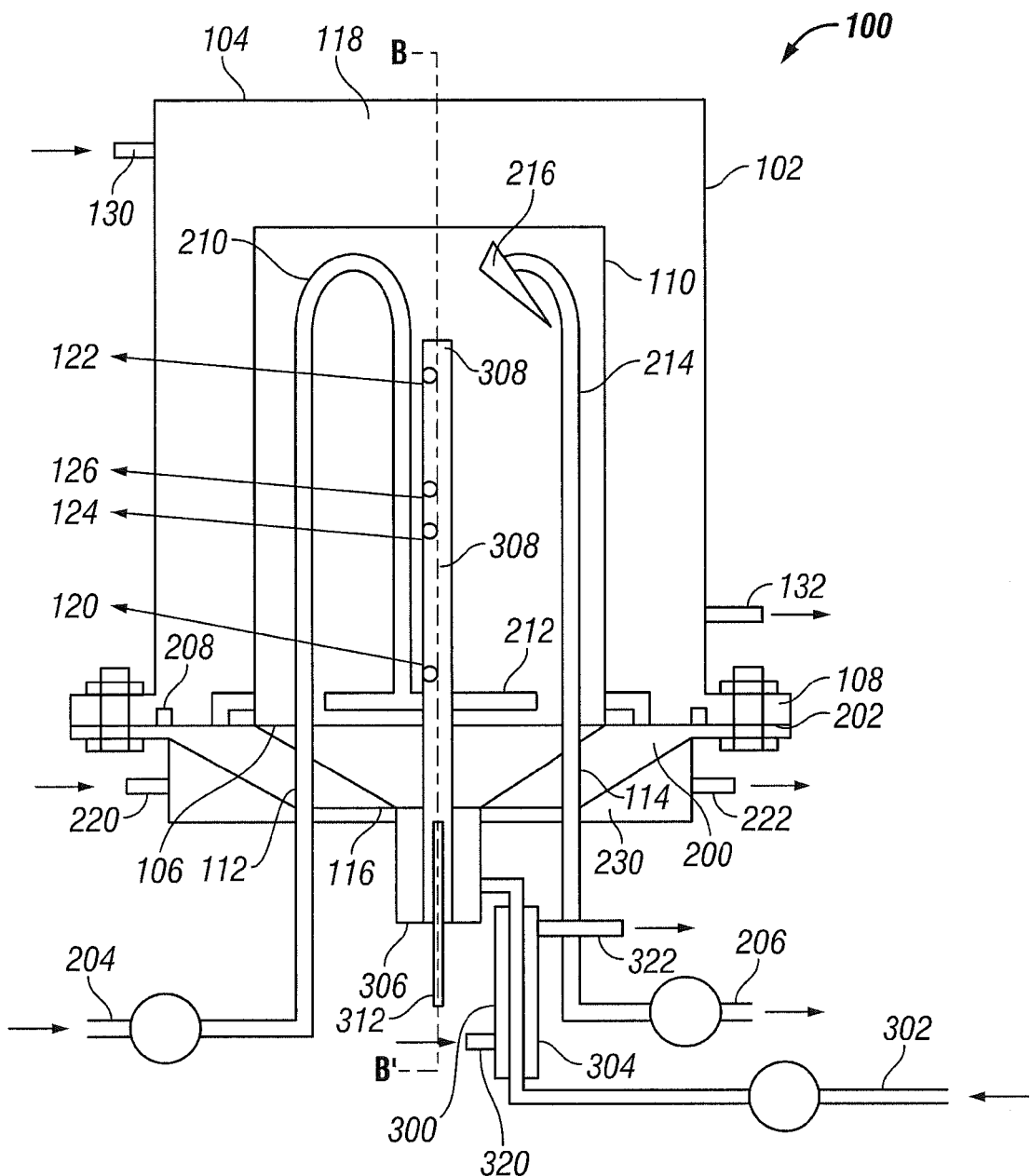
FIG. 2 depicts a cross-sectional view of the evaporator 100 taken at section A-A' of the FIG. 1(A).

FIG. 1(A) depicts a top view of the evaporator 100, while FIG. 1(B) depicts a side view of the evaporator 100. FIG. 2 depicts a cross-sectional view of the evaporator 100 taken at section A-A' of the FIG. 1(A). With reference now to the FIGS. 1(A), 1(B) and 2, the evaporator 100 comprises an outer casing 102 that has first end 104 and a second end 106. The outer casing 102 of the evaporator 100 encloses an inner casing 110 that contains the precursor. The inner casing 110 encloses a first conduit 210 and a second conduit 214 for discharging and removing a carrier gas from the evaporator 100 respectively. In one embodiment the first conduit is an inverted U-shaped conduit 210, while the second conduit is a J-shaped conduit 214. The inner casing 110 also contacts a first precursor conduit 306 that is in fluid communication with a heat exchanger 300. The first precursor conduit 306 contacts a second precursor conduit 302. In an exemplary embodiment, the second precursor conduit 302 has a narrower cross-section that the first precursor conduit 306. The second precursor conduit 302 is enveloped by the heat exchanger 300 as close as possible to the evaporator 100.

The space 118 between the outer casing 102 and the inner casing 110 is filled with a first fluid (e.g., water) that serves to control the temperature of the precursor that is disposed in the inner casing 110. The first fluid enters the space 118 through a port 130 and exits the space through a port 132.

The first end 104 of the outer casing 102 is closed to the environment, while the second end 106 has a first flange 108 that is in communication with an opposing second flange 202 of a plate 200. The first flange 108 and the opposing second flange 202 are in communication with one another via a seal or a gasket 208 that prevents the leakage of the carrier fluid or the precursor. The first flange 108 and the opposing second flange 202 may be sealed together by nuts and bolts, screw threads, clamps or an adhesive bond if desired.

The outer casing 102 can have a hole or a plurality of holes in which are disposed conduits that permit the passage of the carrier fluid and the precursor into the evaporator 100. In an exemplary embodiment, these holes are disposed in the plate 200.

In one embodiment (not shown), the outer casing 102 has a first hole 112, a second hole 114 and a third hole 116. Disposed in the first hole 112 and the second hole 114 and are the inverted U-shaped conduit 210 and the inverted J-shaped conduit 214 respectively. Disposed in the third hole 116 is a conduit 306 that is in fluid communication with the heat exchanger 300. In an exemplary embodiment (shown in the FIG. 2), the plate 200 has a first hole 112, a second hole 114 and a third hole 116 through which pass the inverted U-shaped conduit 210, the inverted J-shaped conduit 214 and a conduit 306 that is in fluid communication with the heat exchanger 300 respectively.

The outer casing 102 and the inner casing 110 can have any desired cross-sectional geometry measured perpendicular to the axis BB'. The inner casing 110 is mounted on the plate 200 and can be concentrically or eccentrically mounted with respect to the outer casing 102. The inner casing 110 is detachably attached to the plate 200 by nuts and bolts, screw threads, and the like. In one embodiment, the inner casing 110 is fixedly attached to the plate 200 by welding. In a further embodiment (not shown), the entire heat exchanger 300 may be integral with the plate 200.

In an exemplary embodiment, the inner casing 110 is screwed onto the plate 200 by screw-threads. A gasket may be disposed between the inner casing 110 and the plate 200 to prevent leaks of the precursor or the carrier fluid. The volume between the inner casing 110 and the outer casing 102 contains a heating or cooling medium the temperature of which is maintained within ±0.05° C. It is desirable for any electronic devices or controllers that regulate the flow of the heating or cooling medium to evaporator to regulate the flow of the heating or cooling fluid such that the precursor displays a vapor pressure constancy of ±0.5% which translates into a temperature constancy of ±0.125° C.

An inverted U-shaped conduit 210 having a first port 204 is disposed in the first hole 112. An inverted J-shaped conduit 214 having a second port 206 is disposed in the second hole 114. A carrier fluid enters the evaporator 100 via the first port 204 and leaves via the second port 206. The first port 204, the second port 206, and the conduit 302 of the heat exchanger 300 each have a valve for controlling the input into the evaporator 100.

The first port 204 is in fluid communication with an inverted U-shaped conduit 210. The other end of the inverted U-shaped conduit 210 is in fluid communication with a sparger 212. The sparger 212 has a porous or perforated surface to permit the carrier fluid that is introduced into the first port 204 to be dispersed through the precursor contained in the inner casing 110. In one embodiment, the sparger 212 has a diameter that is almost equal to the diameter of the inner casing 110. In other words, the circumferential perimeter of the sparger 212 is almost equal to the inner circumference of the inner casing 110. In this embodiment, the sparger can have holes to accommodate the inverted U-shaped conduit and the J-shaped conduit. In another embodiment, the sparger can have a diameter that is small enough to permit the inverted U-shaped conduit and the inverted J-shaped conduit to be located between the circumferential perimeter of the sparger 212 and the inner circumference of the inner casing 110.

In one embodiment, the sparger 212 can be a hollow cylinder that has a porous or perforated surface though which the carrier fluid can be dispersed through the precursor. In another embodiment, the porous surface can comprise a foam that permits the carrier fluid to be dispersed in the form of small bubbles through the precursor. The foam has pores of about 1 micrometer to about 50 micrometers and can comprise a metal, a ceramic, a polymer, or combinations thereof. In one embodiment, the sparger comprises a perforated plate with a hole size of about 1 mm.

The second port 206 is in fluid communication with an inverted J-shaped conduit 214. The other end of the J-shaped conduit is protected by a splash-shield 216. The splash-shield 216 is a plate that is situated about 3 to about 10 millimeters, specifically about 5 millimeters in front of the end of the J-shaped conduit 216. The carrier fluid entrained with the precursor is forced around the splash shield 216 to travel through to the second port 206, which simultaneously prevents droplets of the precursor from doing the same. As can be seen in the FIG. 2, the splash-shield 216 faces the inverted U-tube 210. In one embodiment (not shown), to further prevent the droplets of the precursor from travelling to the second port 206, the splash-shield may face away from the inverted U-tube 210.

The plate 200 has a heating or cooling jacket 230 disposed thereon. The heating or cooling jacket 230 has an inlet port 220 and an exit port 222 through which the heating or cooling fluid flows into and out of the heating or cooling jacket 230.

The inverted U-shaped conduit 210, the inverted J-shaped conduit 214, the splash-shield 216, the inner casing 110, the sparger 212, the first precursor conduit 306, and the second precursor conduit 302, all of which contact the precursor, may be manufactured from materials that can withstand the temperatures of the carrier fluid and/or the precursor. It is also desirable for the material to not react with or corrode under the influence of the precursor and/or the carrier fluid. The carrier fluid comprises hydrogen, oxygen, argon, helium, nitrogen, or the like, or a combination comprising at least one of the foregoing carrier fluids. The precursor can be a gas or a liquid and comprises boron tribromide, phosphorous oxychloride, phosphorous tribromide, silicon tetrachloride, dichlorosilane, silicon tetrabromide, arsenic trichloride, arsenic tribromide, antimony pentachloride, trimethylgallium (TMGa), triethylgallium (TEGa), trimethylaluminum (TMAl), ethyldimethylindium, tertiary-butylarsine, tertiary-butylphosphine, silane ($SiH_4$), dichlorosilane ($SiH_2Cl_2$), germanium tetrachloride ($GeCl_4$), stannic chloride ($SnCl_4$), trimethylarsenic $(CH_3)_3As$, trimethylgallium $(CH_3)_3Ga$, triethylgallium $(C_2H_5)_3Ga$, isobutylgermane $(C_4H_9)GeH_3$, diethyltelluride $(C_2H_5)_2Te$, diisopropyltelluride $(C_3H_7)_2Te$, dimethylzinc $(CH_3)_2Zn$, diethylzinc $(C_2H_5)_2Zn$, trimethylantimony $(CH_3)_3Sb$, triethylantimony $(C_2H_5)_3Sb$, trichlorosilane ($SiHCl_3$), ammonia ($NH_3$), boron trichloride ($BCl_3$), chlorine ($Cl_2$), hydrogen chloride (HCl), hydrogen fluoride (HF), chlorine trifluoride ($ClF_3$), trisilane ($Si_3H_8$), or the like, or a combination comprising at least one of the foregoing precursors.

In one embodiment, it is desirable for the precursor to be a liquid. Examples of liquids are germanium tetrachloride ($GeCl_4$), stannic chloride ($SnCl_4$), trimethylarsenic $(CH_3)_3As$, trimethylgallium $(CH_3)_3Ga$, triethylgallium $(C_2H_5)_3Ga$, isobutylgermane $(C_4H_9)GeH_3$, diethyltelluride $(C_2H_5)_2Te$, diisopropyltelluride $(C_3H_7)_2Te$, dimethylzinc $(CH_3)_2Zn$, diethylzinc $(C_2H_5)_2Zn$, trimethylantimony $(CH_3)_3Sb$, triethylantimony $(C_2H_5)_3Sb$, or the like, or a combination comprising at least one of the foregoing precursors.

In an exemplary embodiment, the U-shaped conduit 210, the inverted J-shaped conduit 214, the splash-shield 216, the inner casing 110, the sparger 212 may be manufactured from a metal, a ceramic, a plastic or a combination thereof.

Suitable metals are stainless steel such as, for example SS316, titanium, titanium alloys, noble metals such as gold, silver, platinum, rhodium, palladium, iridium, aluminum, copper, or the like, or a combination comprising at least one of the foregoing metals. Suitable ceramics are silica, quartz, alumina, titania, or the like, or a combination comprising at least one of the foregoing ceramics. It is desirable to use polymers that have a glass transition temperature and/or a crystalline melting point that is greater than or equal to about room temperature. The polymers may be thermoplastic, thermosets, or combinations thereof. Suitable polymers are polytetrafluoroethylene, polydimethylsiloxane, polyether ether ketone, polyolefins (e.g., polyethylene, polypropylene, or the like), polyvinylchloride, polystyrene, polyester, polyacrylates, phenolics, or the like, or a combination comprising at least one of the foregoing polymers.

The heat exchanger 300 comprises the second precursor conduit 302 and an outer jacket 304. The second precursor conduit 302 is in fluid communication with the first precursor conduit 306 that is disposed in the third hole 116 in the plate 200 and serves to charge the inner casing 110 of the evaporator 100 with the precursor. The plate 200 also has disposed in it a level detection device 308. The level detection device 308 has markings on it to show a low level mark 120, a high level mark 122, a start fill mark 124 and a high level mark (also known as a "stop fill" mark) 126 for the precursor. It is desirable to maintain the precursor in the inner casing 110 between the start fill mark 124 and the stop fill mark 126. By maintaining the precursor between these marks the amount of the precursor vapor in the carrier fluid is maintained within desired limits. The level detection device 308 can be an acoustic device, a pressure column or an optical device. Combinations of the aforementioned level detection devices can be used for enhanced accuracy.

The first precursor conduit 306 also contains a thermocouple or a temperature sensitive resistor 312 that measures the temperature of the precursor in the first precursor conduit 306 after it has left the heat exchanger 300. The thermocouple or temperature sensitive resistor 312 is in electrical communication with a controller (not shown) that supplies heat to the heat exchanger 300. The controller can be a computer, a centralized processing unit, or the like.

When the temperature of the precursor varies by an amount greater than or equal to about ±0.1° C., specifically greater than or equal to about ±0.5° C., the controller communicates with the heat exchanger 300 to adjust the temperature of its heat source, which in turn adjusts the temperature of the precursor. In one embodiment, the heat exchanger 300 may be heated or cooled by using a fluid that enters the outer jacket 304 through port 320 and exits through port 322. In another embodiment, the outer jacket 304 may comprise a resistive heating coil that can be used to heat the precursor.

The precursor level in the inner casing 110 can be controlled by various means. In one embodiment, the precursor content in the evaporator is preferably controlled by monitoring the mass or weight of the evaporator. For this purpose, the evaporator is mounted on a weight scale (not shown) to continuously measure the mass or weight of the vessel. A signal from scale is sent to a controller (not shown), which controls operation of the liquid supply system based on the weight measurement. The controller sends a signal to a valve on the conduit 302, which it continuously controls the flux of liquid introduced into the evaporator to maintain a constant liquid level therein.

In another embodiment, as an extra safety check in the event scale malfunctions, liquid level sensors, for example, float switches, to detect high and/or low liquid levels in the evaporator can be installed. These sensors can be connected to an alarm system to alert the operator of any abnormal condition. To allow visual monitoring and observation of the liquid level and dispersion of the carrier fluid in the precursor, an optional sight glass assembly can be installed in the vessel. The sight glass assembly should be leak proof so as to avoid leakage and contamination of the precursor. The sight glass is preferably constructed of a quartz lens sealed with an o-ring.

While the FIGS. 1(A), 1(B) and 2 display only a single heat exchanger in fluid communication with a single evaporator, it is possible to have multiple heat exchangers in fluid communication with a single evaporator.

In one embodiment, in one method of manufacturing the evaporator 100, a plate 200 having a first hole 112, a second hole 114, and a third hole 116 is fitted with the inverted U-shaped conduit 210, the inverted J-shaped conduit 214 and the first precursor conduit 306 to which is affixed the heat exchanger 300 and the level detection device 308. The inverted J-shaped conduit 214 has the splash shield disposed thereon. The inner casing 110 is screwed onto the plate 200. In one embodiment, the inner casing 100 is welded onto the plate 200. A seal is disposed between the inner casing and the plate 200. The inner casing 110 covers the U-shaped conduit 210, the inverted J-shaped conduit 214 and the first precursor conduit 306 to which is affixed the heat exchanger 300 and the level detection device 308. The opposing second flange 202 of the plate 200 is then aligned with the first flange 108 and the two flanges are bolted together to encapsulate the gasket 208.

In one embodiment, in one method of operating the evaporator 100, a precursor from a storage tank (not shown) is first introduced into the heat exchanger 300. The storage tank maintains the precursor at a temperature that is substantially similar to the temperature of the evaporator 100. The heat exchanger 300 heats or cools the precursor to a desired temperature. A controller that is in communication with the evaporator 100 determines the amount of the carrier fluid and the amount of the precursor that are desired in the evaporator. The desired amount of the precursor is discharged into the evaporator 100 and is stored in the inner casing 110.

The precursor is discharged from the heat exchanger 300 to the evaporator 100 in amounts that are determined by the controller. The carrier fluid is discharged from a separate storage tank (not shown) to the evaporator 100. The carrier fluid enters the inverted U-shaped conduit and is discharged via the sparger 212 into the inner casing 110. The inner casing 110 contains the precursor at the desired temperature. The carrier fluid bubbles through the precursor in the inner casing 110 and some of the precursor in entrained in the carrier fluid. The carrier fluid with the precursor entrained thereon then travels through the inverted J-shaped conduit 214 to the processing chamber where it is desired.

As noted above, by having the heat exchanger 300 disposed proximate to the evaporator 100, such that there is very little fluctuation in the temperature or the vapor pressure of the precursor present in the inner casing 110. This results in a substantially constant supply fluid to the processing chamber, wherein the fluid has a substantially constant ratio of carrier fluid to precursor. In one embodiment, the heat exchanger 300 is disposed so close to the evaporator 100, that the weight ratio of the carrier fluid to the precursor is substantially constant after being removed from the evaporator by the second conduit. This happens even when the ambient temperature fluctuates by a amount of up to ±15° C., specifically by an amount of up to ±25° C., and more specifically by an amount of up to ±35° C. In a further embodiment, the heat exchanger 300 is integral with the evaporator 100.

In one embodiment, the heat exchanger 300 is disposed so close to the evaporator 100, that the weight ratio (concentration) of the carrier fluid to the precursor does not change by an amount of greater than or equal to about 0.1%, specifically greater than or equal to about 0.2%, and more specifically greater than or equal to about 0.5%. This happens even when the ambient temperature fluctuates by a amount of up to ±15° C., specifically by an amount of up to ±25° C., and more specifically by an amount of up to ±35° C.

While the invention has been described in detail in connection with a number of embodiments, the invention is not limited to such disclosed embodiments. Rather, the invention can be modified to incorporate any number of variations, alterations, substitutions or equivalent arrangements not heretofore described, but which are commensurate with the scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A device comprising:
an evaporator; and
a heat exchanger; the heat exchanger being in fluid communication with the evaporator;
the evaporator comprising:
an outer casing; and
an inner casing that is disposed within the outer casing; the inner casing contacting a plate; wherein the inner casing encloses:
a first conduit that is operative to introduce a carrier fluid into the evaporator;
wherein the first conduit is an inverted U-shaped conduit that has one end in fluid communication with a first port for introducing the carrier fluid into the evaporator and an opposing end in fluid communication with a sparger; and a second conduit that is operative to remove the carrier fluid entrained with a precursor; wherein the outer casing is detachably attached to the plate; the plate contacting a first precursor conduit that is operative to introduce the precursor into the evaporator from the heat exchanger; where the heat exchanger is disposed proximate to the evaporator at a distance effective to maintain the precursor in the evaporator at a substantially constant temperature when the ambient temperature around the heat exchanger and the evaporator fluctuates by an amount of up to about ±35° C.

2. The device of claim 1, wherein the second conduit is an inverted J-shaped conduit that has one end in fluid communication with a second port for removing the carrier fluid entrained with a precursor from the evaporator and an opposing end in fluid communication with a splash shield.

3. The device of claim 1, wherein the proximity of the heat exchanger to the evaporator is effective to maintain a ratio of the carrier fluid to the precursor that does not change by an amount of greater than or equal to about 0.5% when the ambient temperature around the heat exchanger and the evaporator fluctuates by an amount of up to about ±35° C.

4. The device of claim 1, wherein the proximity of the heat exchanger to the evaporator is effective to maintain a variation in temperature of the precursor in a fluid path from the heat exchanger to the evaporator to be less than or equal to about ±0.1° C.

5. The device of claim 1, wherein the inverted U-shaped conduit is disposed in the evaporator via a hole in the plate.

6. The device of claim 2, wherein the inverted J-shaped conduit is disposed in the evaporator via a hole in the plate.

7. A method comprising:
heating or cooling a precursor in a heat exchanger;
discharging the precursor from the heat exchanger to an evaporator; the evaporator comprising:
an outer casing; and
an inner casing that is disposed within the outer casing; the inner casing contacting a plate; wherein the inner casing encloses:
a first conduit; wherein the first conduit is an inverted U-shaped conduit that has one end in fluid communication with a first port for introducing a carrier fluid into the evaporator and an opposing end in fluid communication with a sparger; and
a second conduit; wherein the second conduit is an inverted J-shaped conduit that has one end in fluid communication with a second port for removing the carrier fluid entrained with a precursor from the evaporator and an opposing end in fluid communication with a splash shield;
introducing a carrier fluid into the evaporator via the first conduit;
sparging the precursor with the carrier fluid; and
removing the carrier fluid entrained with the precursor from the evaporator via the second conduit; where the proximity of the heat exchanger to the evaporator is effective to maintain the precursor in the evaporator at a substantially constant temperature when the ambient temperature around the heat exchanger and the evaporator fluctuates by an amount of up to about ±35° C.

8. The method of claim 7, further comprising circulating a fluid in a space between the outer casing and the inner casing.

9. A method for manufacturing a device comprising:
disposing an inverted U-shaped conduit in a first hole, an inverted J-shaped conduit in a second hole and a first precursor conduit in a third hole on a plate; the plate being affixed with a heat exchanger; and
disposing an inner casing and an outer casing on a side of the plate that is opposed to a side where the heat exchanger contacts the plate; the inner casing being contained in the outer casing; the inner casing enclosing the inverted U-shaped conduit, the inverted J-shaped conduit and the first precursor conduit.

10. A device comprising:
an evaporator; and
a heat exchanger; the heat exchanger being in fluid communication with the evaporator;
the evaporator comprising:
an outer casing; and
an inner casing that is disposed within the outer casing; the inner casing contacting a plate; wherein the inner casing encloses:
a first conduit that is operative to introduce a carrier fluid into the evaporator; and
a second conduit that is operative to remove the carrier fluid entrained with a precursor; wherein the outer casing is detachably attached to the plate; the plate contacting a first precursor conduit that is operative to introduce the precursor into the evaporator from the heat exchanger; where the heat exchanger is disposed proximate to the evaporator at a distance effective to maintain the precursor in the evaporator at a substantially constant temperature when the ambient temperature around the heat exchanger and the evaporator fluctuates by an amount of up to about ±35° C.; wherein the second conduit is an inverted J-shaped conduit that has one end in fluid communication with a second port for removing the carrier fluid entrained with a precursor from the evaporator and an opposing end in fluid communication with a splash shield.

11. The device of claim 10, wherein the first conduit is an inverted U-shaped conduit that has one end in fluid communication with a first port for introducing the carrier fluid into the evaporator and an opposing end in fluid communication with a sparger.

12. The device of claim 10, wherein the proximity of the heat exchanger to the evaporator is effective to maintain a ratio of the carrier fluid to the precursor that does not change by an amount of greater than or equal to about 0.5% when the ambient temperature around the heat exchanger and the evaporator fluctuates by an amount of up to about ±35° C.

13. The device of claim 10, wherein the proximity of the heat exchanger to the evaporator is effective to maintain a variation in temperature of the precursor in a fluid path from the heat exchanger to the evaporator to be less than or equal to about ±0.1° C.

14. The device of claim 10, wherein the first conduit is an inverted U-shaped conduit is disposed in the evaporator via a hole in the plate.

15. The device of claim 10, wherein the inverted J-shaped conduit is disposed in the evaporator via a hole in the plate.

* * * * *